(12) United States Patent
Mittal et al.

(10) Patent No.: US 10,101,756 B2
(45) Date of Patent: *Oct. 16, 2018

(54) SYSTEMS AND METHODS FOR REDUCING LEAKAGE POWER OF A SYSTEM ON CHIP WITH INTEGRATED THERMOELECTRIC COOLING

(71) Applicant: QUALCOMM INCORPORATED, San Diego, CA (US)

(72) Inventors: Rajat Mittal, San Diego, CA (US); Hee Jun Park, San Diego, CA (US); Young Hoon Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 485 days.

This patent is subject to a terminal disclaimer.

(21) Appl. No.: 14/446,258

(22) Filed: Jul. 29, 2014

(65) Prior Publication Data

US 2016/0033975 A1    Feb. 4, 2016

(51) Int. Cl.
*H01L 23/34*    (2006.01)
*G05D 23/19*    (2006.01)
(Continued)

(52) U.S. Cl.
CPC ..... *G05D 23/1917* (2013.01); *G05B 13/0205* (2013.01); *G06F 1/206* (2013.01); *G06F 1/3206* (2013.01); *H01L 23/34* (2013.01); *H01L 23/38* (2013.01); *H01L 25/0652* (2013.01); *H01L 25/0655* (2013.01); *H01L 25/072* (2013.01);
(Continued)

(58) Field of Classification Search
CPC ............ G05D 23/1917; G05D 13/0205; G06F 1/206; G06F 1/3206; H01L 23/34; H01L 23/38; H01L 25/0652; H01L 25/0655; H01L 25/072
See application file for complete search history.

(56) References Cited

U.S. PATENT DOCUMENTS 6,230,497 B1    5/2001  Morris et al.
6,825,687 B2   11/2004  Keshavarzi et al.
(Continued)

FOREIGN PATENT DOCUMENTS

CN    1890878 A    1/2007
CN    102082133 A    6/2011
JP    H0831994 A    2/1996

OTHER PUBLICATIONS

International Search Report and Written Opinion—PCT/US2015/041629—ISA/EPO—dated Dec. 10, 2015.

*Primary Examiner* — Charles E Anya
(74) *Attorney, Agent, or Firm* — Smith Tempel Blaha LLC

(57) ABSTRACT

Systems, methods, and computer programs are disclosed for reducing leakage power of a system on chip (SoC). One such method comprises monitoring a plurality of temperature differentials across a respective plurality of thermoelectric coolers on a system on chip (SoC). Each of the thermoelectric coolers is dedicated to a corresponding one of a plurality of chip sections on the SoC. The thermoelectric coolers are controlled based on the plurality of temperature differentials to minimize a sum of a combined power consumption of the plurality of chip sections and the plurality of corresponding dedicated thermoelectric coolers.

24 Claims, 9 Drawing Sheets

(51) Int. Cl.
  *G05B 13/02* (2006.01)
  *G06F 1/20* (2006.01)
  *H01L 23/38* (2006.01)
  *H01L 25/065* (2006.01)
  *H01L 25/07* (2006.01)
  *G06F 1/32* (2006.01)

(52) U.S. Cl.
  CPC ...... *H01L 2924/0002* (2013.01); *Y02D 10/16* (2018.01)

(56) References Cited

U.S. PATENT DOCUMENTS

| | | | |
|---|---|---|---|
| 7,301,233 B2 | 11/2007 | Lee et al. | |
| 7,436,059 B1 | 10/2008 | Ouyang | |
| 7,809,965 B2* | 10/2010 | Ziarnik | G06F 1/206 165/121 |
| 8,209,989 B2 | 7/2012 | Chaparro Monferrer et al. | |
| 8,868,947 B2* | 10/2014 | Park | G06F 1/203 713/320 |
| 2002/0063327 A1 | 5/2002 | Chu et al. | |
| 2005/0007845 A1 | 1/2005 | Angerer et al. | |
| 2005/0008072 A1 | 1/2005 | Angerer et al. | |
| 2005/0052196 A1 | 3/2005 | Borkar | |
| 2005/0078451 A1 | 4/2005 | Sauciuc et al. | |
| 2009/0093917 A1* | 4/2009 | Smith | F25B 49/005 700/300 |
| 2009/0293500 A1* | 12/2009 | Chen | F25B 21/02 62/3.7 |
| 2011/0316606 A1* | 12/2011 | Ladurner | H03K 17/14 327/378 |
| 2012/0039041 A1* | 2/2012 | Mowry | G06F 1/206 361/695 |
| 2012/0143540 A1* | 6/2012 | Chen | G01D 4/004 702/62 |
| 2012/0287571 A1* | 11/2012 | Santos | G06F 1/20 361/679.48 |
| 2013/0037620 A1* | 2/2013 | Aryanfar | G06F 1/206 236/49.3 |
| 2013/0254563 A1* | 9/2013 | Culbert | G06F 1/20 713/300 |
| 2014/0012445 A1* | 1/2014 | Fleckenstein | H01M 10/486 701/22 |
| 2014/0048111 A1* | 2/2014 | Hinsperger | H01L 35/30 136/201 |
| 2014/0176041 A1* | 6/2014 | Sun | H01L 35/30 320/101 |
| 2015/0028337 A1* | 1/2015 | Kartal | H01L 27/0255 257/48 |
| 2015/0346798 A1* | 12/2015 | Dongara | G06F 1/3206 713/320 |

* cited by examiner

SYSTEMS AND METHODS FOR REDUCING LEAKAGE POWER OF A SYSTEM ON CHIP WITH INTEGRATED THERMOELECTRIC COOLING

DESCRIPTION OF THE RELATED ART

Portable computing devices (e.g., cellular telephones, smart phones, tablet computers, portable digital assistants (PDAs), and portable game consoles) continue to offer an ever-expanding array of features and services, and provide users with unprecedented levels of access to information, resources, and communications. To keep pace with these service enhancements, such devices have become more powerful, more complex. Portable computing devices now commonly include system-on-chips (SoCs) and/or multiple microprocessor cores embedded on a single substrate (e.g., a central processing unit (CPU), graphics processing unit (GPU), etc.), allowing users to execute complex and power intensive software applications. However, increased performance and functionality requirements present significant design and operational challenges for managing battery life and power consumption.

Demands for more performance and functionality drive chipmakers to scale to smaller silicon process technology nodes (e.g., smaller dimension, transistor gate lengths, etc.). Scaling to smaller silicon technology nodes, however, disadvantageously increases the leakage contribution to the total power consumption. As process technology continues to scale down (approaching and exceeding 20 nm), leakage power continues to be a significant problem. For example, transistor leakage increases dues to smaller gate lengths and dimensions. Furthermore, a higher concentration of transistors implies higher power densities and, therefore, higher operating temperatures. Chipset leakage power scales exponentially with temperature. Because of this compounded effect and the further scaling of process technology, there is a need in the art for improved systems and methods for reducing leakage power in SoCs.

SUMMARY OF THE DISCLOSURE

Systems, methods, and computer programs are disclosed for reducing leakage power of a system on chip (SoC). One embodiment is a method for reducing leakage power of an SoC. One such method comprises monitoring a plurality of temperature differentials across a respective plurality of thermoelectric coolers on a system on chip (SoC). Each of the thermoelectric coolers is dedicated to a corresponding one of a plurality of chip sections on the SoC. The thermoelectric coolers are controlled based on the plurality of temperature differentials to minimize a sum of a combined power consumption of the plurality of chip sections and the plurality of corresponding dedicated thermoelectric coolers.

Another embodiment is a system for reducing leakage power of an SoC. One such system comprises an SoC and a thermoelectric cooler controller. The SoC comprises a plurality of chip sections. Each chip section has a dedicated and separately controlled thermoelectric cooler. The thermoelectric cooler controller comprises logic configured to: monitor a temperature differential across each of the respective thermoelectric coolers on the SoC; and control the plurality of thermoelectric coolers based on the plurality of temperature differentials to minimize a sum of a combined power consumption of the plurality of chip sections and the plurality of corresponding dedicated thermoelectric coolers on the SoC.

Yet another embodiment comprises a computer program embodied in a computer-readable medium and executed by a processor for reducing leakage power of a system on chip (SoC). The computer program comprises logic configured to monitor a plurality of temperature differentials across a respective plurality of thermoelectric coolers on a system on chip (SoC). Each of the thermoelectric coolers is dedicated to a corresponding one of a plurality of chip sections on the SoC. Further logic is configured to control the plurality of thermoelectric coolers based on the plurality of temperature differentials to minimize a sum of a combined power consumption of the plurality of chip sections and the plurality of corresponding dedicated thermoelectric coolers.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral may encompass all parts having the same reference numeral in all Figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the terms "communication device," "wireless device," "wireless telephone", "wireless communication device," and "wireless handset" are used interchangeably. With the advent of third generation ("3G") wireless technology and four generation ("4G"), greater bandwidth availability has enabled more portable computing devices with a greater variety of wireless capabilities. Therefore, a portable computing device may include a cellular telephone, a pager, a PDA, a smartphone, a navigation device, or a hand-held computer with a wireless connection or link.

Figure 1A:
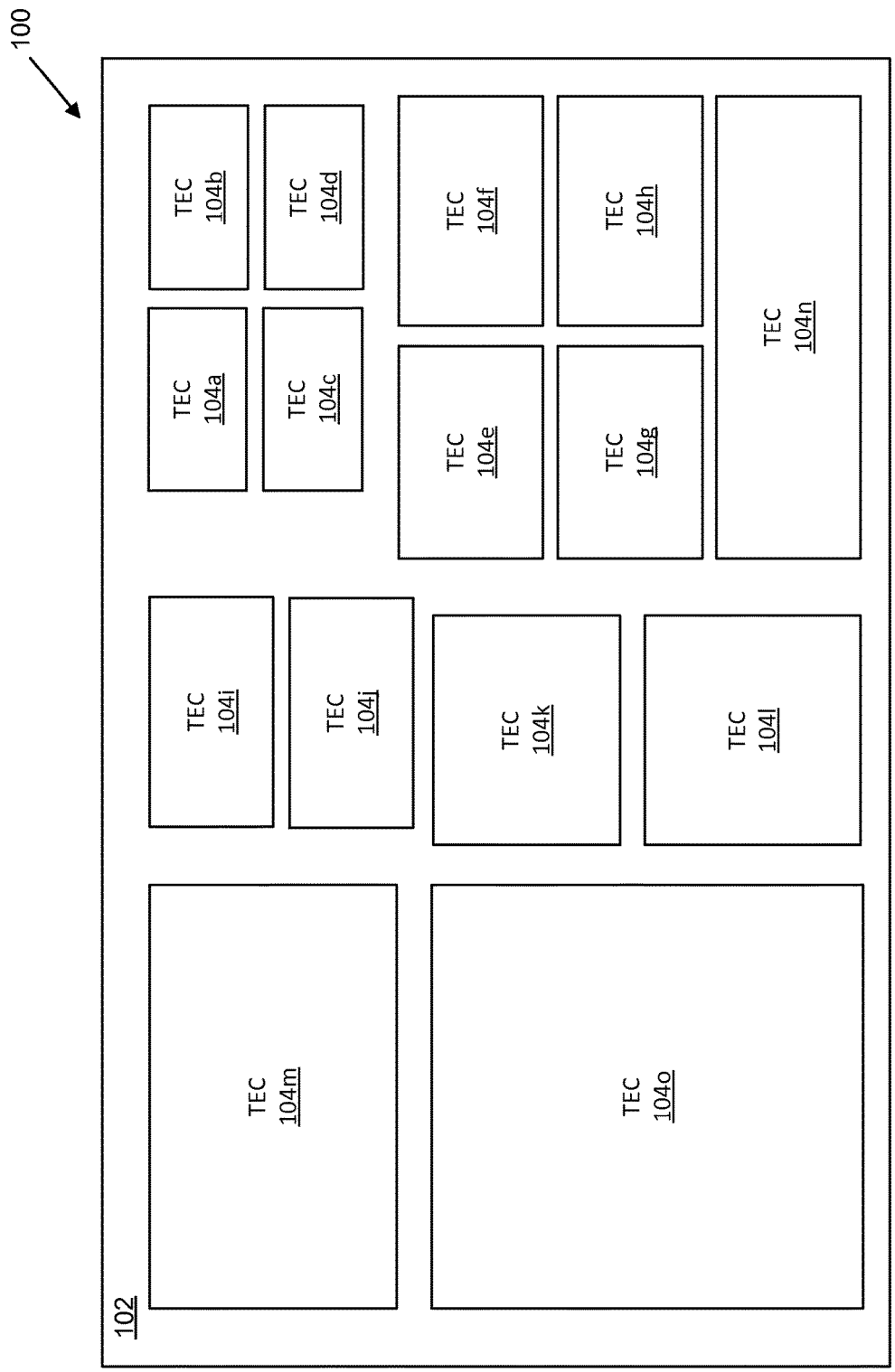
FIG. 1a is a schematic diagram of an embodiment of a system on chip (SoC) comprising an array of dedicated thermoelectric coolers for optimizing thermoelectric cooling to minimize overall power consumption of the SoC.
Figure 1B:
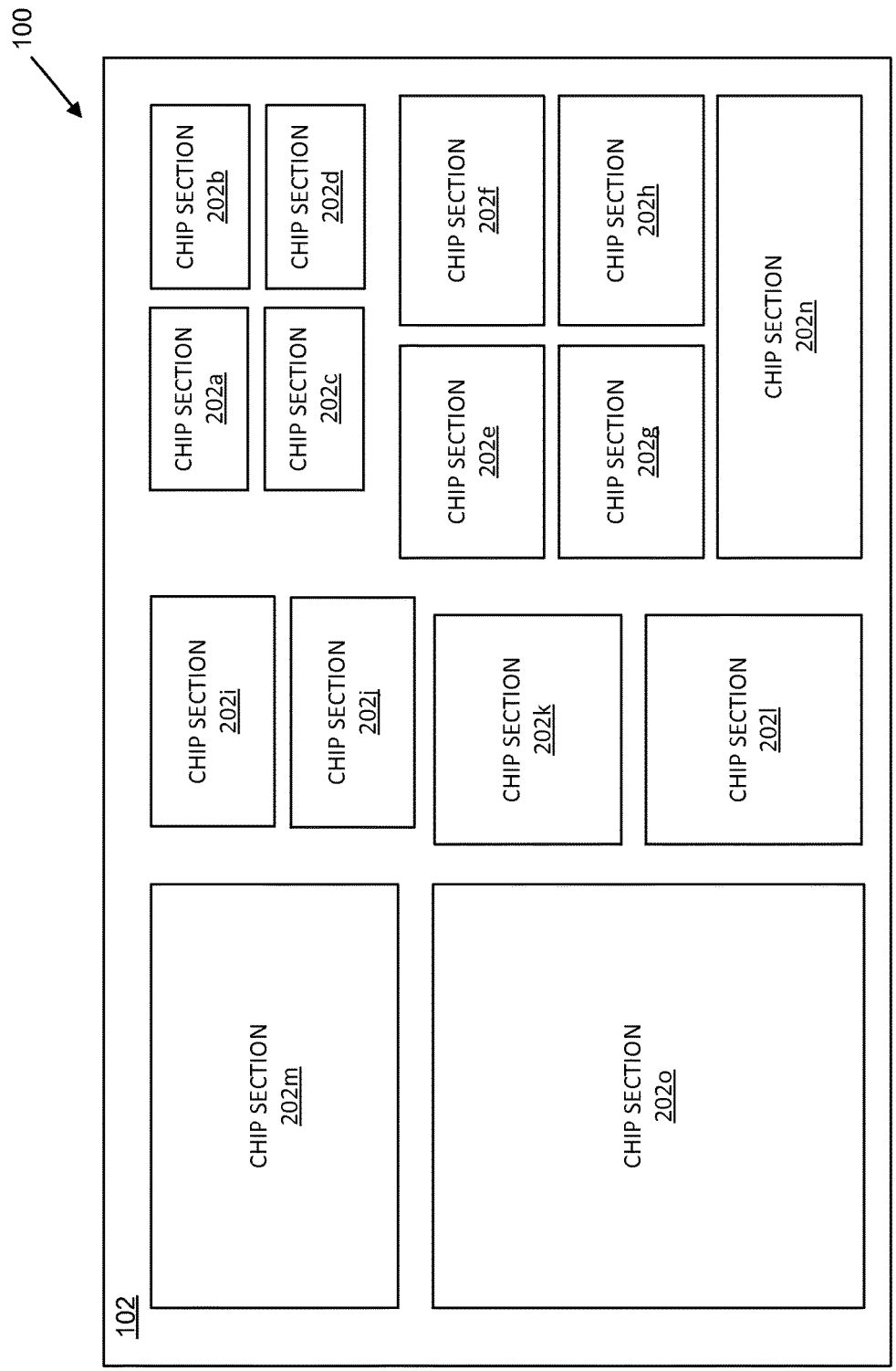
FIG. 1b is a schematic diagram of the SoC of FIG. 1a illustrating a plurality of chip sections arranged underneath the corresponding dedicated thermoelectric coolers.

FIGS. 1a and 1b are schematic diagrams of a system-on-chip (SoC) 100 for implementing various embodiments of systems and methods for reducing leakage power. The SoC 100 comprises a plurality of thermoelectric coolers 104 arranged on a chip floorplan 102 such that each thermoelectric cooler 104 operates as a dedicated thermoelectric cooling device for a corresponding chip section 202 on the SoC 100. It should be appreciated that the number, configuration, arrangement, etc. of the thermoelectric coolers 104 and chip sections 202 may vary depending on the particular type, characteristics, design, floorplan, and/or purpose of the SoC 100. The embodiment of FIGS. 1a and 1b illustrate fifteen thermoelectric coolers 104a-104o dedicated to fifteen corresponding chip sections 202a-202o on the SoC 202.

As known in the art, a chip section 202 may be referred to as a chip block or intellectual property (IP) block and may comprise one or more units of logic, cell(s), or chip layout associated with the SoC 100. In an embodiment, a chip section 202 may comprise a central processing unit (CPU), a graphics processing unit (GPU), a digital signal processor (DSP), a mobile display processor, a video encoder, or other functional blocks or chip devices.

Figure 2:
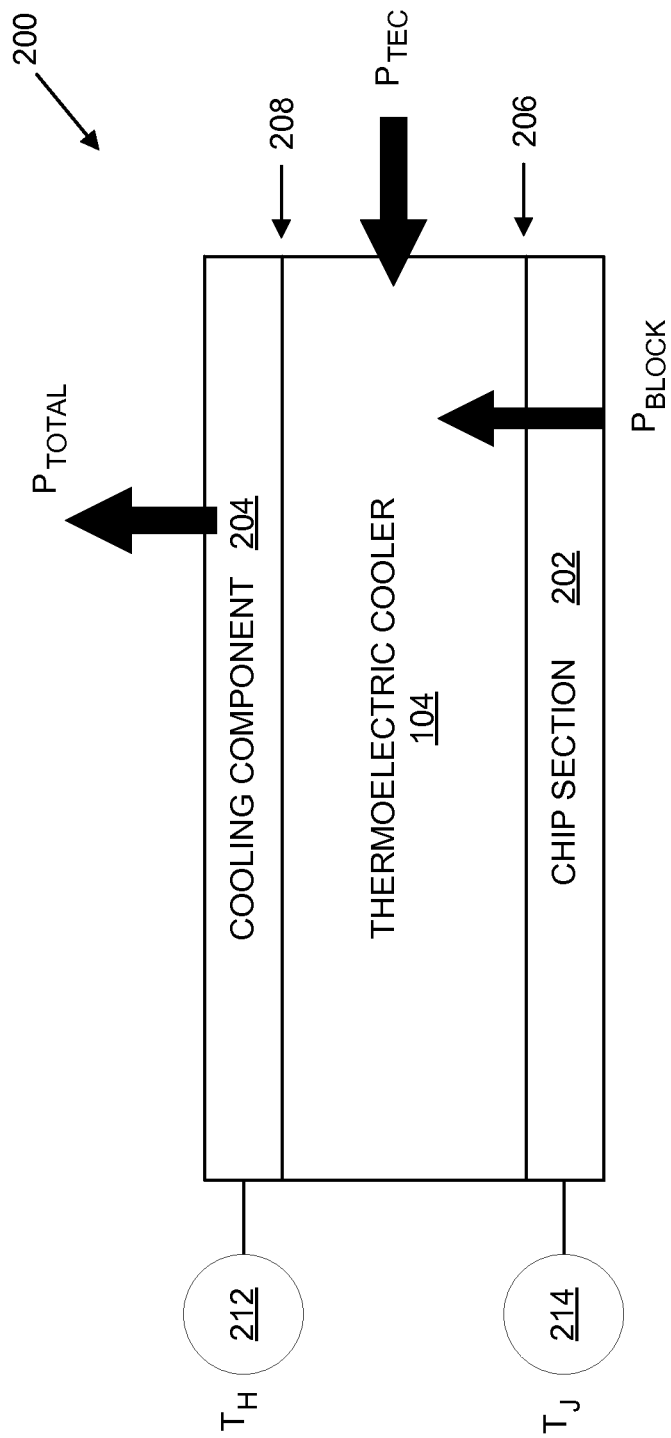
FIG. 2 is a cross-sectional view of the SoC in FIGS. 1a & 1b illustrating an exemplary chip section and a dedicated thermoelectric cooler.

As illustrated in FIG. 2, each thermoelectric cooler 104 comprises a cold-side junction 206 and a hot-side junction 208. The cold-side junction 206 is adjacent the corresponding chip section 202 being cooled by the thermoelectric cooler 104. The hot-side junction 208 is adjacent, for example, a cooling component 204. The cooling component 204 may comprise, for example, any cooling material, solution, or electronic component. In an embodiment, the cooling component 204 may comprise a heat sink base or the SoC package. One or more sensors (e.g., sensors 212 and 214) may be incorporated to monitor the temperature of the cold-side junction 206 ($T_C$) and the temperature of the hot-side junction 208 ($T_H$). As a chip section 202 consumes power ($P_{BLOCK}$) during operation of the SoC 100, the junction temperatures ($T_H$ and $T_C$) may reach undesirable levels, and thermoelectric cooling may be initiated by applying a voltage or current to the thermoelectric cooler 104. In this regard, the cooling comes at the cost of extra electrical power to operate the thermoelectric cooler 104 ($P_{TEC}$), resulting in total power consumption ($P_{TOTAL}$) equal to the sum of $P_{BLOCK}$ and $P_{TEC}$.

As known in the art, the thermoelectric cooler 104 may comprise two ceramic substrates that serve as a foundation and electrical insulation for a P-type die and an N-type die that are connected electrically in series and thermally in parallel between the ceramics. The ceramic substrates serve as insulation between the internal electrical elements and a heat sink that may be in contact with the hot-side junction 208 as well as an object against the cold-side junction 206. An electrically conductive material, such as, for example, copper pads attached to the ceramics, may maintain electrical connections inside the thermoelectric cooler 104. It should be appreciated that the above description of components of the thermoelectric cooler 104 are for exemplary purposes only. The configuration, components, materials, etc. of the thermoelectric coolers 104 may be modified as desired.

Figure 3:
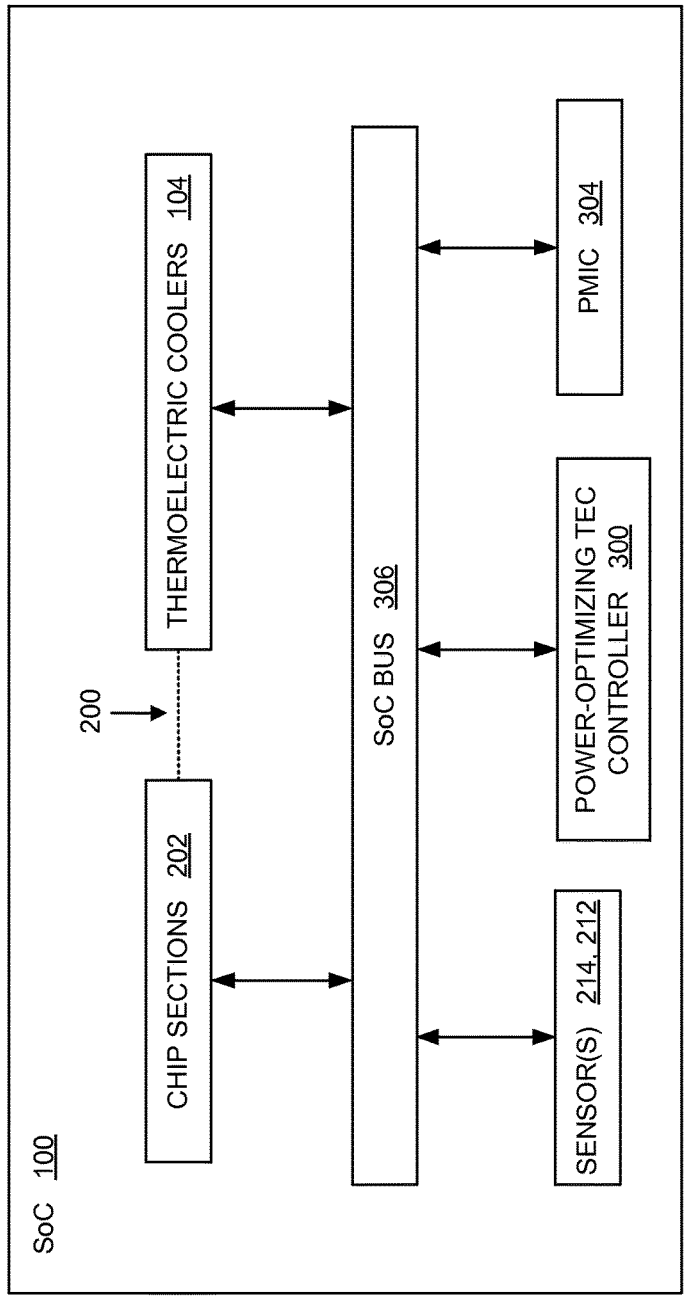
FIG. 3 is a block diagram illustrating an embodiment of the SoC in FIG. 1.

FIG. 3 illustrates an embodiment of the SoC 100 comprising a plurality of chip sections 202 with an associated array of dedicated, individually addressable thermoelectric coolers 104. The SoC 100 further comprises a power-optimizing thermoelectric cooler controller 300 that may be electrically coupled, via a SoC bus 306, with one or more of the chip sections 202, sensors 212 and 214, thermoelectric coolers 104, and a power management component (e.g., PMIC 304). The controller 300 is configured to separately control the junction temperatures of the thermoelectric coolers 104. It should be appreciated that the controller 300 may execute various algorithms for optimizing power consumption of the chip sections 202 and the thermoelectric coolers 104. As described below in more detail, the power optimization algorithm(s) may be configured to minimize the overall power consumption of the plurality of chip sections 202 and the thermoelectric coolers 104 and, thereby, enable a longer battery life. For example, referring to FIG. 2, the total power consumption ($P_{TOTAL}$) may be minimized for each thermoelectric cooler 104 and/or collectively minimized by summing the total power consumption ($P_{TOTAL}$) of each of the plurality of thermoelectric coolers 104. The total power consumption ($P_{TOTAL}$) may be minimized by operating the thermoelectric cooler(s) at an optimal operating point.

Figure 5:
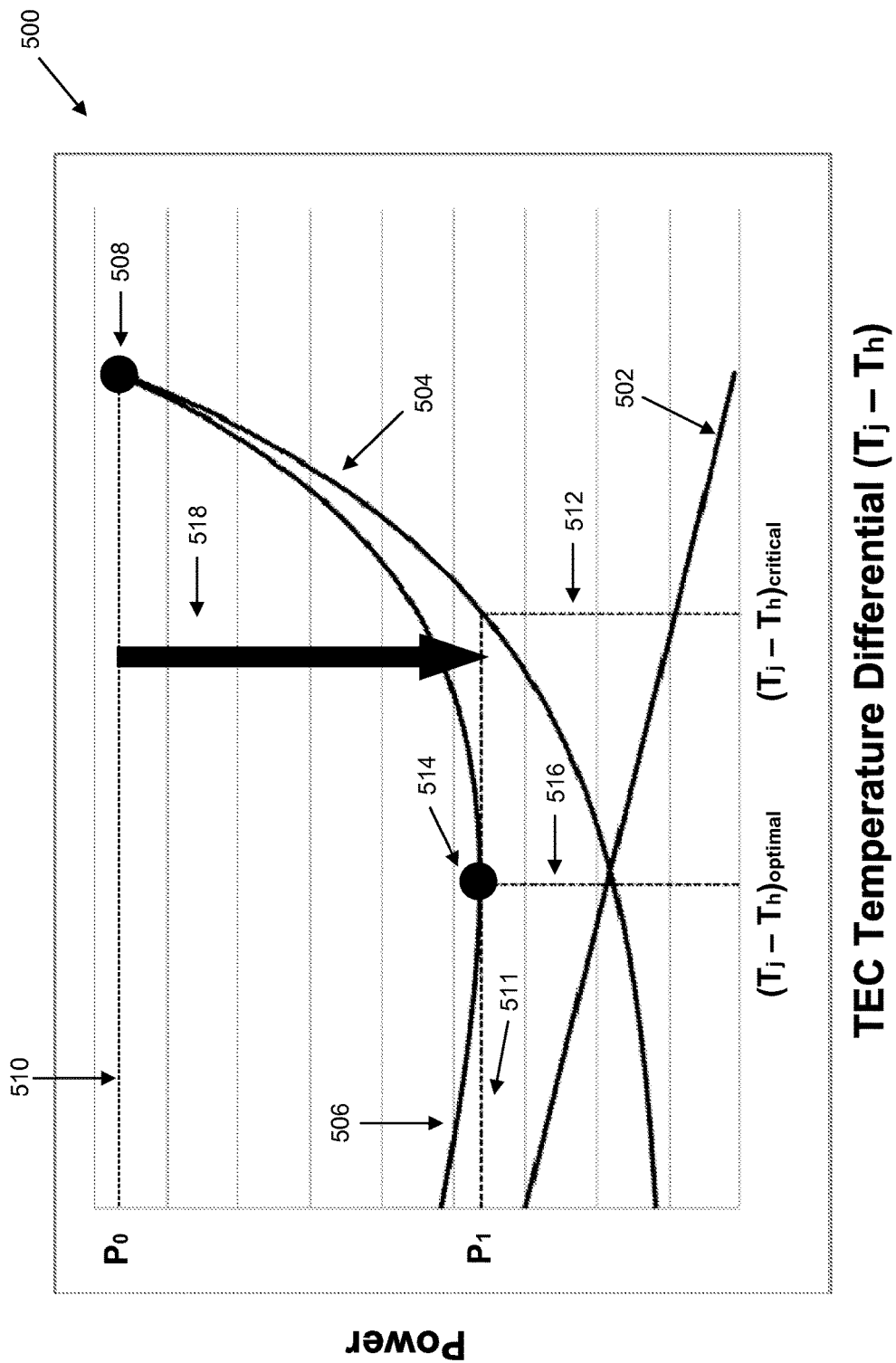
FIG. 5 is a power consumption curve for an exemplary thermoelectric cooler illustrating an optimal operating point for minimizing combined power consumption of the thermoelectric cooler and the corresponding SoC chip section.

FIG. 5 is a graph 500 illustrating power consumption curves for an exemplary embodiment of a block 202 and a thermoelectric cooler 104. Line 502 illustrates the power consumption of a thermoelectric cooler 104 ($P_{TEC}$) as a function of a temperature differential between the cold-side junction temperature ($T_j$) and the hot-side junction temperature ($T_H$). Curve 504 illustrates power consumption of a chip section 202 or IP block ($P_{BLOCK}$) as a function of the junction temperature differential ($T_j$-$T_H$). Curve 506 illustrates the combined power consumption ($P_{TOTAL}$=$P_{BLOCK}$+$P_{TEC}$).

A hypothetical operating point 508 illustrates a conventional approach to controlling a thermoelectric cooler 104, which is designed merely for thermal management, not power minimization. At the hypothetical operating point 508, the total power consumption ($P_{TOTAL}$) has a value $P_0$ represented by line 510. As illustrated by dark arrow 518, the controller 300 enables thermoelectric cooling to be performed but at an optimal operating point 514, which results in a significant reduction in total power consumption. At the optimal operating point 514, the thermoelectric cooler 104 may be operated with a total power consumption P1 (represented by line 511), where $P_1 \ll P_0$. As described below in more detail with reference to the algorithms illustrated in FIGS. 6 and 7, if the temperature differential ($T_j - T_H$) exceeds a predetermined threshold (e.g., the temperature differential illustrated by line 512), the controller 300 may turn on the thermoelectric cooler 104 and drive, for example, an input current to the optimal operating point 514. The operating point 514 may be calculated by the controller 300. In other embodiments, the optimal operating point 514 may be defined by a predetermined temperature differential (e.g., line 516) based on, for example, the characteristics of the chip section 202 and/or the thermoelectric cooler 104.

Figure 4:
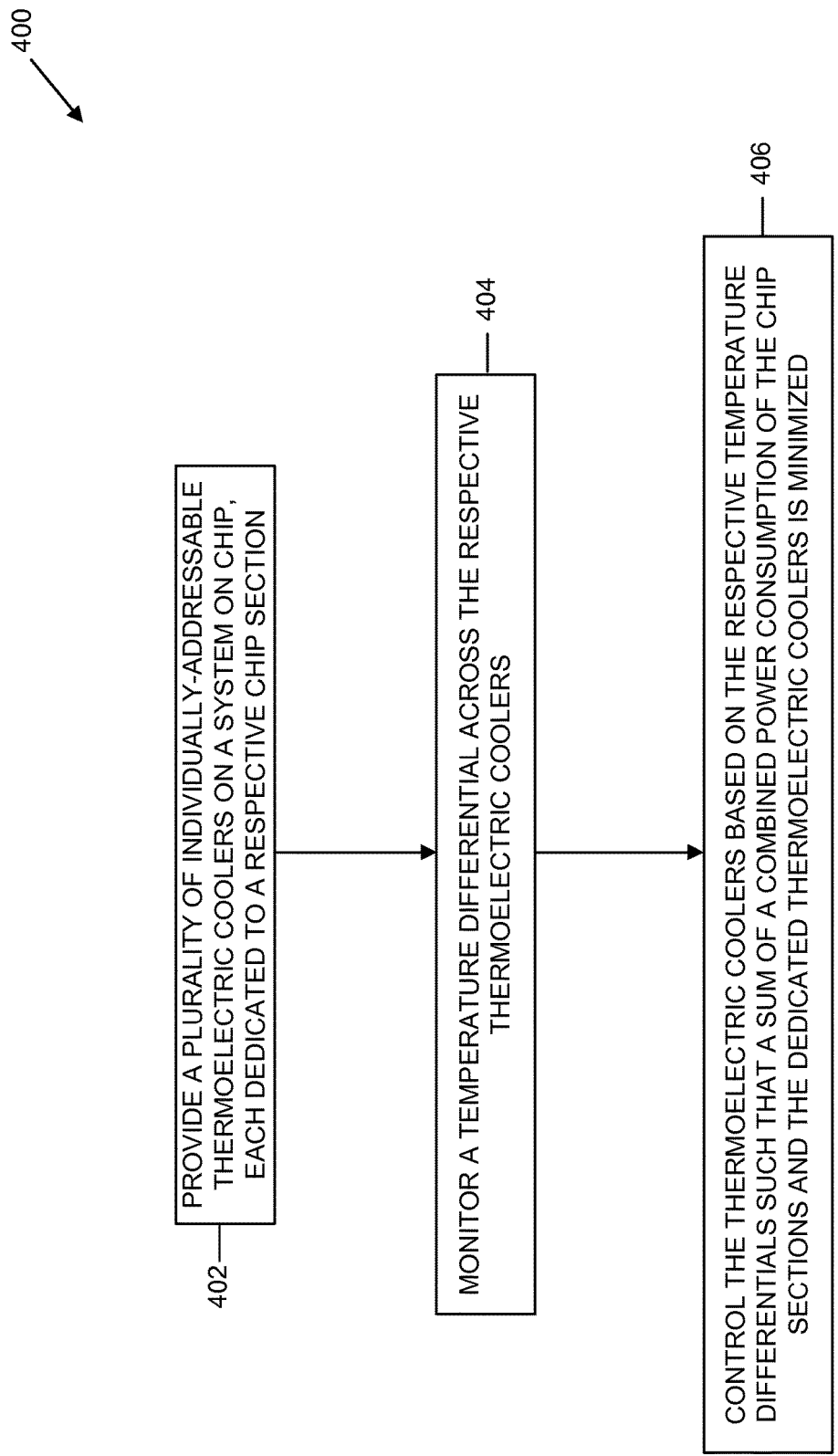
FIG. 4 is flowchart illustrating an embodiment of a method for optimizing thermoelectric cooling to minimize overall power consumption of the SoC.

FIG. 4 illustrates a method 400 for minimizing combined power consumption of a plurality of chip sections 202 and dedicated thermoelectric coolers 104 on a SoC 100. At block 402, a plurality of individually addressable thermoelectric coolers 104 are provided on the SoC 100. Each thermoelectric cooler 104 is dedicated to a chip section 202, and may be arranged as illustrated in FIGS. 1a, 1b, and 2. At block 402, the controller 300 may monitor a temperature differential ($T_j - T_H$) across the respective thermoelectric coolers 104. The junction temperatures may be determined by one or more sensors (e.g., sensors 212 and 214) and provided to, or read, by the controller 300. Based on the monitored temperature differentials, the controller 300 may control the thermoelectric coolers 104 such that a sum of a combined power consumption of the chip sections 202 and the dedicated thermoelectric coolers 104 is minimized. The controller 300 may separately minimize combined power consumption ($P_{TOTAL}$) for a single thermoelectric cooler 104, a group of thermoelectric coolers 104, or all of the thermoelectric coolers 104 on the SoC 100.

Figure 6:
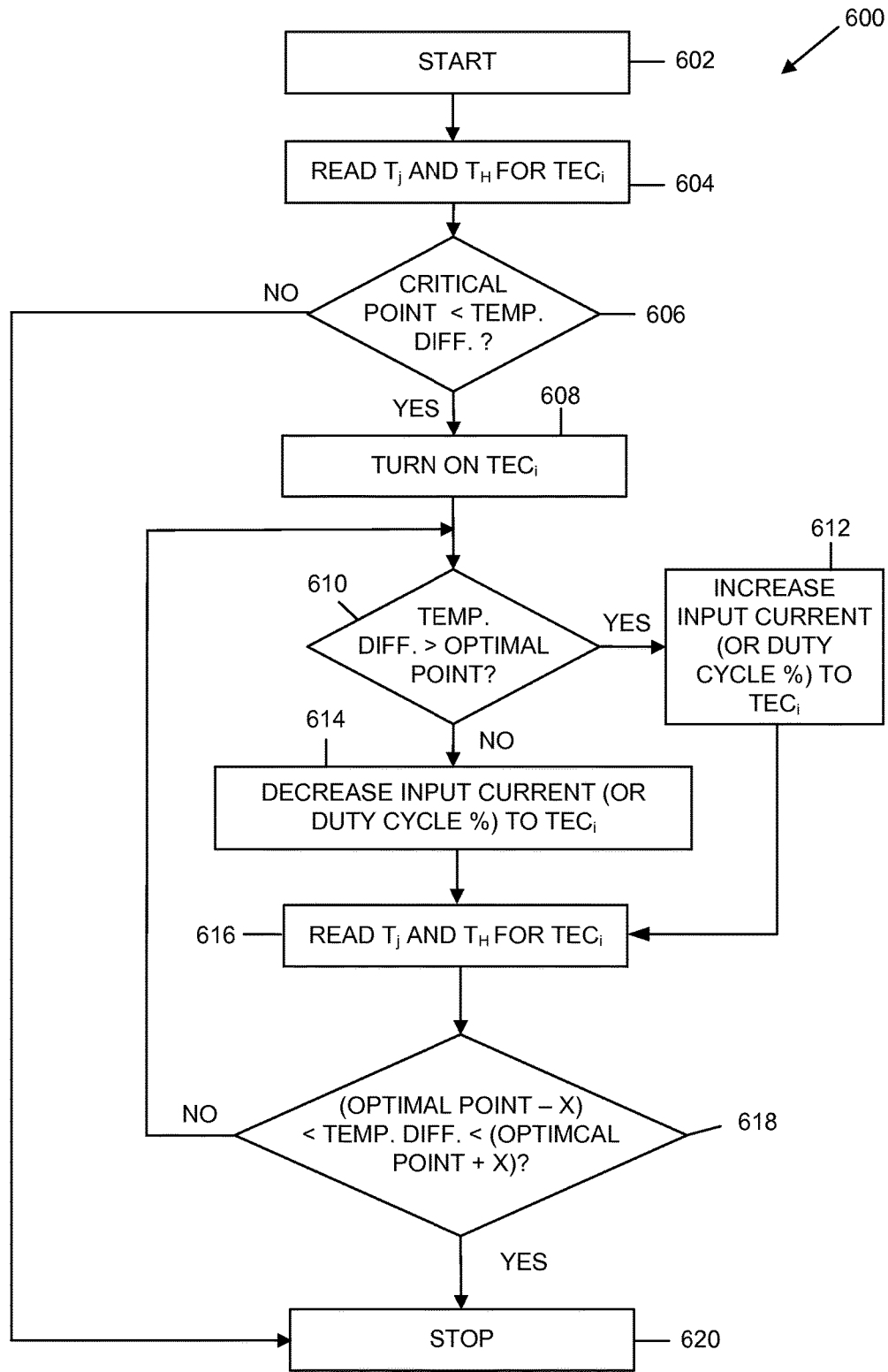
FIG. 6 is a flowchart illustrating an embodiment of an algorithm implemented by the power minimization thermoelectric cooler controller in FIG. 3.

FIG. 6 illustrates an embodiment of a power optimization algorithm 600 implemented by the controller 300. The algorithm 600 may be periodically performed at a predetermined or calculated interval for each of the thermoelectric coolers 104 on the SoC 100. The process starts at block 602 for an exemplary thermoelectric cooler ($TEC_i$), where i=1 to N, and N=a number of thermoelectric coolers 104 on the SoC 100). It should be appreciated that the algorithm 600 may be performed for each $TEC_i$ in parallel, substantially in parallel, or otherwise. At block 604, the controller 300 reads the junction temperatures $T_j$ and $T_H$ for a first thermoelectric cooler 104 (TEC). At decision block 606, the controller 300 determines whether the temperature differential ($T_j - T_H$) exceeds a critical operating point. The critical operating point may be determined by estimating the leakage power. In other embodiments, the critical operating point may comprise a predetermined temperature differential, as illustrated in FIG. 5. If the temperature differential does not exceed the critical operating point, the algorithm for $TEC_i$ may stop at block 620. If the temperature differential exceeds the critical operating point, at block 608, the controller 300 may turn on the thermoelectric cooler $TEC_i$.

At decision block 610, the controller 300 determines whether the temperature differential is greater than an optimal operating point (e.g., operating point 514—FIG. 5). If "yes", at block 612, the controller 300 may increase an input current to the thermoelectric cooler $TEC_i$ or increase a duty cycle % of the input current, with flow passing to block 616 to re-read the junction temperatures. If "no", at block 614, the controller 300 may decrease the input current to the thermoelectric cooler $TEC_i$ or increase the duty cycle % of the input current. At block 616, the controller 300 reads the junction temperatures $T_j$ and $T_H$. At decision block 618, the controller determines whether the temperature differential is within a range close to the optimal point (e.g., (optimal point−X)<temperature differential<(optimal point+X). The value of X may be predetermined or calculated to define an operating state in which the temperature differential is considered to have reached or approximated the optimal point. If $TEC_i$ is considered to be operating at the optimal operating point, the process may stop at block 620. If $TEC_i$ is not operating at the optimal operating point, flow may return to decision block 610 for further processing and control.

Figure 7:
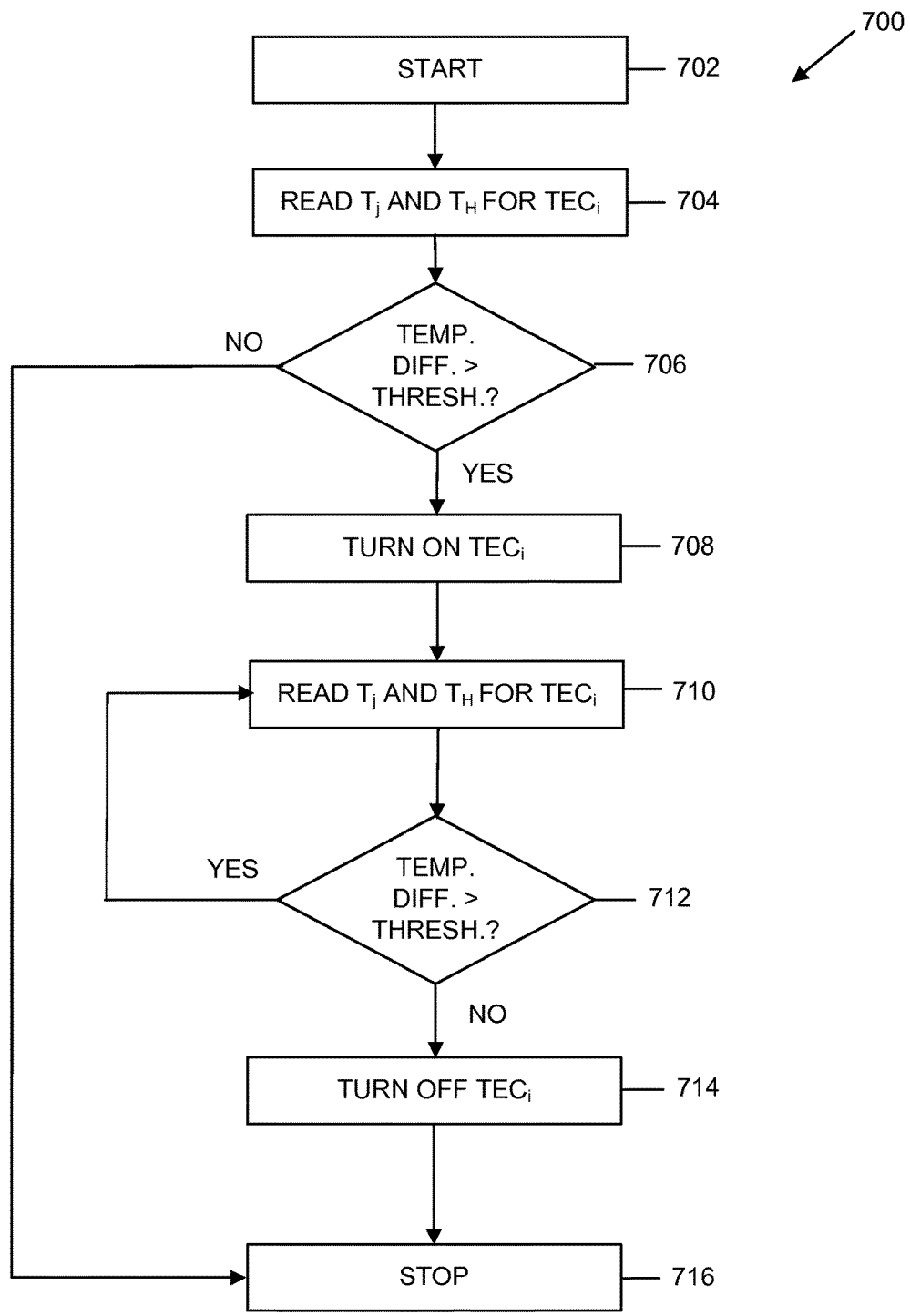
FIG. 7 is a flowchart illustrating another embodiment of an algorithm implemented by the power minimization thermoelectric cooler controller in FIG. 3.

FIG. 7 illustrates another embodiment of a power optimization algorithm 700 implemented by the controller 300. Algorithm 700 is configured to maintain a junction temperature associated with a predetermined threshold. The algorithm 700 may be periodically performed at a predetermined or calculated interval for each of the thermoelectric coolers 104 on the SoC 100. The process starts at block 702 for an exemplary thermoelectric cooler ($TEC_i$), where i=1 to N, and N=a number of thermoelectric coolers 104 on the SoC 100). It should be appreciated that the algorithm 700 may be performed for each $TEC_i$ in parallel, substantially in parallel, or otherwise. At block 704, the controller 300 reads the junction temperatures $T_j$ and $T_H$ for a first thermoelectric cooler 104 ($TEC_i$). At decision block 706, the controller 300 determines whether the temperature differential ($T_j - T_H$) exceeds the threshold. If the temperature differential exceeds the threshold, the thermoelectric cooler $TEC_i$ is turned on at block 708. If the temperate differential does not exceed the threshold, the process may stop at block 716.

After turning on the thermoelectric cooler $TEC_i$, at block 710, the controller 300 may read the junction temperatures $T_j$ and $T_H$ and determine whether the temperature differential exceeds the threshold (decision block 712). If the threshold is exceeded, flow returns to block 710. If the threshold is not exceeded, the controller 300 may turn off the thermoelectric cooler $TEC_i$ and stop the process at block 716.

Figure 8:
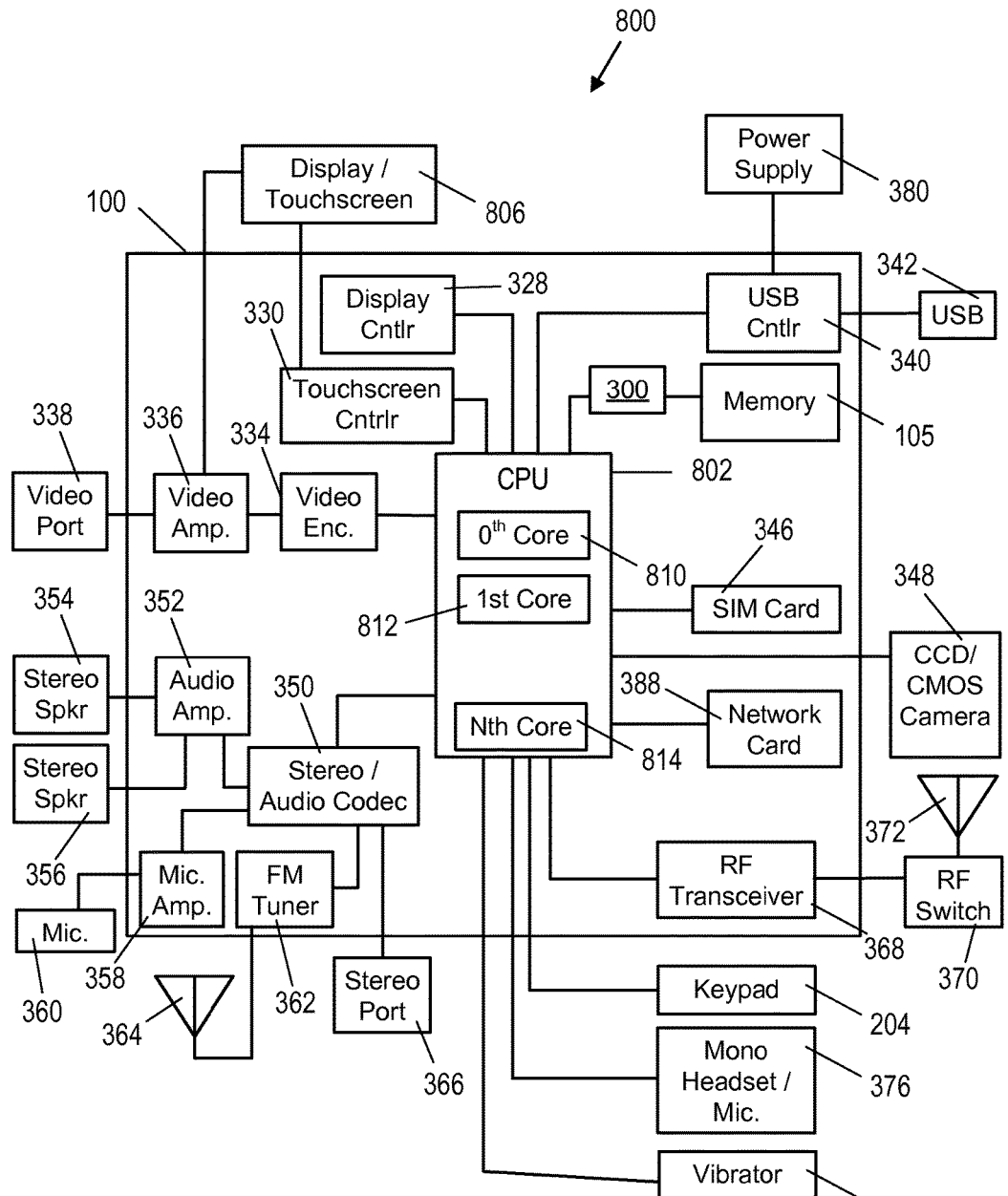
FIG. 8 is a block diagram of an embodiment of a portable computer device comprising the system of FIG. 1.

The SoC 100 may be implemented in any integrated circuit, multi-chip package, or computing device, including a personal computer, a workstation, a server, a portable computing device (PCD), such as a cellular telephone, a smart phone, a portable digital assistant (PDA), a portable game console, a palmtop computer, or a tablet computer. FIG. 8 illustrates the SoC 100 incorporated in an exemplary portable computing device (PCD) 800. The SoC 100 may include a multicore CPU 802. The multicore CPU 802 may include a zeroth core 810, a first core 812, and an Nth core 814. One of the cores may comprise GPU with one or more of the others comprising the CPU.

A display controller 328 and a touch screen controller 330 may be coupled to the CPU 802. In turn, the touch screen display 806 external to the on-chip system 100 may be coupled to the display controller 328 and the touch screen controller 330.

FIG. 8 further shows that a video encoder 334 (e.g., a phase alternating line (PAL) encoder, a sequential color a memoire (SECAM) encoder, or a national television system (s) committee (NTSC) encoder) is coupled to the multicore CPU 802. Further, a video amplifier 336 is coupled to the video encoder 334 and the touch screen display 806. Also, a video port 338 is coupled to the video amplifier 336. As shown in FIG. 8, a universal serial bus (USB) controller 340 is coupled to the multicore CPU 802. Also, a USB port 342 is coupled to the USB controller 340. Memory 105 and a subscriber identity module (SIM) card 346 may also be coupled to the multicore CPU 802. Memory 105 may reside on the SoC 100 or be coupled to the SoC 100. The memory 105 may comprise a DRAM memory system.

Further, as shown in FIG. 8, a digital camera 348 may be coupled to the multicore CPU 802. In an exemplary aspect, the digital camera 348 is a charge-coupled device (CCD) camera or a complementary metal-oxide semiconductor (CMOS) camera.

As further illustrated in FIG. 8, a stereo audio coder-decoder (CODEC) 350 may be coupled to the multicore CPU 802. Moreover, an audio amplifier 352 may coupled to the stereo audio CODEC 350. In an exemplary aspect, a first stereo speaker 354 and a second stereo speaker 356 are coupled to the audio amplifier 352. FIG. 8 shows that a microphone amplifier 358 may be also coupled to the stereo audio CODEC 350. Additionally, a microphone 360 may be coupled to the microphone amplifier 358. In a particular aspect, a frequency modulation (FM) radio tuner 362 may be coupled to the stereo audio CODEC 350. Also, an FM antenna 364 is coupled to the FM radio tuner 362. Further, stereo headphones 366 may be coupled to the stereo audio CODEC 350.

FIG. 8 further illustrates that a radio frequency (RF) transceiver 368 may be coupled to the multicore CPU 802. An RF switch 370 may be coupled to the RF transceiver 368 and an RF antenna 372. A keypad 204 may be coupled to the multicore CPU 802. Also, a mono headset with a microphone 376 may be coupled to the multicore CPU 802. Further, a vibrator device 378 may be coupled to the multicore CPU 802.

FIG. 8 also shows that a power supply 380 may be coupled to the SoC 100. In a particular aspect, the power supply 380 is a direct current (DC) power supply that provides power to the various components of the PCD 800 that require power. Further, in a particular aspect, the power supply is a rechargeable DC battery or a DC power supply that is derived from an alternating current (AC) to DC transformer that is connected to an AC power source.

FIG. 8 further indicates that the PCD 800 may also include a network card 388 that may be used to access a data network (e.g., a local area network, a personal area network, or any other network). The network card 388 may be a Bluetooth network card, a WiFi network card, a personal area network (PAN) card, a personal area network ultra-low-power technology (PeANUT) network card, a television/cable/satellite tuner, or any other network card well known in the art. Further, the network card 388 may be incorporated into a chip (i.e., the network card 388 may be a full solution in a chip, and may not be a separate network card 388).

As depicted in FIG. 8, the touch screen display 806, the video port 338, the USB port 342, the camera 348, the first stereo speaker 354, the second stereo speaker 356, the microphone 360, the FM antenna 364, the stereo headphones 366, the RF switch 370, the RF antenna 372, the keypad 374, the mono headset 376, the vibrator 378, and the power supply 380 may be external to the SoC 100.

It should be appreciated that one or more of the method steps described herein may be stored in the memory as computer program instructions, such as the modules described above. These instructions may be executed by any suitable processor in combination or in concert with the corresponding module to perform the methods described herein.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example.

Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the Figures which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, NAND flash, NOR flash, M-RAM, P-RAM, R-RAM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a coaxial cable, fiber optic cable, twisted pair, digital subscriber line ("DSL"), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc ("CD"), laser disc, optical disc, digital versatile disc ("DVD"), floppy disk and blu-ray disc where disks usually reproduce data magnetically, while discs reproduce data optically with lasers. Combinations of the above should also be included within the scope of computer-readable media.

Alternative embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A method for reducing leakage power of a system on chip (SoC), the method comprising:
   monitoring a plurality of temperature differentials across a respective plurality of thermoelectric coolers on the SoC, each of the thermoelectric coolers dedicated to a corresponding one of a plurality of chip sections on the SoC and configured to cool the corresponding one of the plurality of chip sections on the SoC, wherein monitoring the temperature differential comprises monitoring the temperature of a cold side junction between a first side of each thermoelectric cooler and a corresponding chip section adjacent thereto and monitoring the temperature of a hot side junction between an opposing second side of each thermoelectric cooler and a corresponding cooling element adjacent thereto, wherein the temperature differential across each thermoelectric cooler is monitored separately by a controller coupled to each of the plurality of thermoelectric coolers; and
   based on the monitored temperature differentials across the plurality of thermoelectric coolers, controlling an input current provided to the plurality of thermoelectric coolers to, in response to the input current, maintain the temperature differentials of the plurality of thermoelectric coolers within a range of an optimal operating point on a curve representing a sum of a combined power consumption of the plurality of chip sections and the plurality of corresponding dedicated thermoelectric coolers, wherein a minimum on the curve defines the optimal operating point, and wherein the input current of each of the plurality of thermoelectric coolers is controlled by the controller.

2. The method of claim 1, further comprising:
   if the temperature differential across one of the thermoelectric coolers exceeds a predetermined critical operating point, turning on the corresponding thermoelectric cooler.

3. The method of claim 1, wherein the predetermined optimal operating point is based on a thermoelectric cooler power consumption curve and a chip section power consumption curve.

4. The method of claim 1, wherein the plurality of chip sections comprise one or more of a central processing unit (CPU), a graphics processing unit (GPU), and a digital signal processor, a mobile display processor, and a video encoder.

5. The method of claim 1, wherein the SoC resides on a portable communication device.

6. The method of claim 5, wherein the portable communication devices comprises one of a smart phone, a mobile phone, a tablet computer, and a portable game console.

7. A system for reducing leakage power of a system on chip (SoC), the system comprising:
   means for monitoring a plurality of temperature differentials across a respective plurality of thermoelectric coolers on the SoC, each of the thermoelectric coolers dedicated to a corresponding one of a plurality of chip sections on the SoC and configured to cool the corresponding one of the plurality of chip sections on the SoC, wherein monitoring the temperature differential comprises monitoring the temperature of a cold side junction between a first side of each thermoelectric cooler and a corresponding chip section adjacent thereto and monitoring the temperature of a hot side junction between an opposing second side of each thermoelectric cooler and a corresponding cooling element adjacent thereto, wherein the temperature differential across each thermoelectric cooler is monitored separately by a controller coupled to each of the plurality of thermoelectric coolers; and
   means for controlling an input current provided to the plurality of thermoelectric coolers based on the monitored temperature differentials across the plurality of thermoelectric coolers to, in response to the input current, maintain the temperature differentials of the plurality of thermoelectric coolers within a range of an optimal operating point on a curve representing a sum of a combined power consumption of the plurality of chip sections and the plurality of corresponding dedicated thermoelectric coolers, wherein a minimum on the curve defines the optimal operating point, and wherein the input current of each of the plurality of thermoelectric coolers is controlled by the controller.

8. The system of claim 7, further comprising:
   means for turning on the corresponding thermoelectric cooler if the temperature differential across one of the thermoelectric coolers exceeds a predetermined critical operating point.

9. The system of claim 7, wherein the predetermined optimal operating point is based on a thermoelectric cooler power consumption curve and a chip section power consumption curve.

10. The system of claim 7, wherein the plurality of chip sections comprise one or more of a central processing unit (CPU), a graphics processing unit (GPU), and a digital signal processor, a mobile display processor, and a video encoder.

11. The system of claim 7, wherein the SoC resides on a portable communication device.

12. The system of claim 11, wherein the portable communication devices comprises one of a smart phone, a mobile phone, a tablet computer, and a portable game console.

13. A computer program embodied in a non-transitory computer-readable medium and executed by a processor for reducing leakage power of a system on chip (SoC), the computer program comprising logic configured to:
   monitor a plurality of temperature differentials across a respective plurality of thermoelectric coolers on the SoC, each of the thermoelectric coolers dedicated to a corresponding one of a plurality of chip sections on the SoC and configured to cool the corresponding one of the plurality of chip sections on the SoC, wherein monitoring the temperature differential comprises monitoring the temperature of a cold side junction between a first side of each thermoelectric cooler and a corresponding chip section adjacent thereto and monitoring the temperature of a hot side junction between an opposing second side of each thermoelectric cooler and a corresponding cooling element adjacent thereto, wherein the temperature differential across each thermoelectric cooler is monitored separately by a controller coupled to each of the plurality of thermoelectric coolers; and
   control an input current provided to the plurality of thermoelectric coolers based on the monitored temperature differentials across the plurality of thermoelectric coolers to, in response to the input current, maintain the temperature differentials of the plurality of thermoelectric coolers within a range of an optimal operating point on a curve representing a sum of a combined power consumption of the plurality of chip sections and the plurality of corresponding dedicated thermoelectric coolers, wherein a minimum on the curve defines the optimal operating point, and wherein the input current of each of the plurality of thermoelectric coolers is controlled by the controller.

14. The computer program of claim 13, further comprising logic configured to:
if the temperature differential across one of the thermoelectric coolers exceeds a predetermined critical operating point, turn on the corresponding thermoelectric cooler.

15. The computer program of claim 13, wherein the predetermined optimal operating point is based on a thermoelectric cooler power consumption curve and a chip section power consumption curve.

16. The computer program of claim 13, wherein the plurality of chip sections comprise one or more of a central processing unit (CPU), a graphics processing unit (GPU), and a digital signal processor, a mobile display processor, and a video encoder.

17. The computer program of claim 13, wherein the SoC resides on a portable communication device.

18. The computer program of claim 13, wherein the portable communication devices comprises one of a smart phone, a mobile phone, a tablet computer, and a portable game console.

19. A system for reducing leakage power of a system on chip (SoC), the system comprising:
a dedicated and separately controlled thermoelectric cooler located in and configured to cool each of a plurality of chip sections of the SoC; and
a thermoelectric cooler controller comprising logic configured to:
monitor a temperature differential across each of the respective thermoelectric coolers on the SoC, wherein monitoring the temperature differential comprises monitoring the temperature of a cold side junction between a first side of each thermoelectric cooler and a corresponding chip section adjacent thereto and monitoring the temperature of a hot side junction between an opposing second side of each thermoelectric cooler and a corresponding cooling element adjacent thereto, wherein the temperature differential across each thermoelectric cooler is monitored separately by a controller coupled to each of the plurality of thermoelectric coolers; and
based on the monitored temperature differentials across the plurality of thermoelectric coolers, control an input current provided to the plurality of thermoelectric coolers to, in response to the input current, maintain the temperature differentials of the plurality of thermoelectric coolers within a range of an optimal operating point on a curve representing a sum of a combined power consumption of the plurality of chip sections and the plurality of corresponding dedicated thermoelectric coolers on the SoC, wherein a minimum on the curve defines the optimal operating point, and wherein the input current of each of the plurality of thermoelectric coolers is controlled by the controller.

20. The system of claim 19, wherein the thermoelectric cooler controller further comprises logic configured to:
if the temperature differential across one of the thermoelectric coolers exceeds a predetermined critical operating point, turn on the corresponding thermoelectric cooler.

21. The system of claim 19, wherein the predetermined optimal operating point is based on a thermoelectric cooler power consumption curve and a chip section power consumption curve.

22. The system of claim 19, wherein the plurality of chip sections comprise one or more of a central processing unit (CPU), a graphics processing unit (GPU), and a digital signal processor, a mobile display processor, and a video encoder.

23. The system of claim 19, wherein the SoC resides on a portable communication device.

24. The system of claim 23, wherein the portable communication device comprises one of a smart phone, a mobile phone, a tablet computer, and a portable game console.

* * * * *